(12) United States Patent
Lee et al.

(10) Patent No.: US 7,692,427 B2
(45) Date of Patent: Apr. 6, 2010

(54) MAGNETIC RESONANCE IMAGING RF COIL DECOUPLING CIRCUIT

(75) Inventors: Wonje Lee, Pewaukee, WI (US); Krishna N. Kurpad, Middleton, WI (US); Eddy B. Boskamp, Menomonee Falls, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 11/746,504

(22) Filed: May 9, 2007

(65) Prior Publication Data
US 2007/0262775 A1 Nov. 15, 2007

Related U.S. Application Data

(60) Provisional application No. 60/798,872, filed on May 9, 2006.

(51) Int. Cl.
*G01V 3/00* (2006.01)
(52) U.S. Cl. .................................. 324/322; 324/318
(58) Field of Classification Search ......... 324/300–322; 600/407–445
See application file for complete search history.

(56) References Cited

U.S. PATENT DOCUMENTS

| | | | |
|---|---|---|---|
| 5,675,290 A * | 10/1997 | Tsukahara et al. | 330/277 |
| 6,501,274 B1 | 12/2002 | Ledden | |
| 6,906,518 B2 * | 6/2005 | Leussler | 324/318 |
| 6,933,724 B2 * | 8/2005 | Watkins et al. | 324/319 |
| 6,982,554 B2 | 1/2006 | Kurpad et al. | |
| 7,279,901 B2 * | 10/2007 | Diehl et al. | 324/320 |
| 7,336,074 B2 * | 2/2008 | Yang et al. | 324/318 |
| 7,417,435 B2 * | 8/2008 | Diehl | 324/320 |
| 2003/0227330 A1 * | 12/2003 | Khanifar et al. | 330/302 |
| 2005/0231203 A1 | 10/2005 | Feiweier et al. | |

FOREIGN PATENT DOCUMENTS

WO 2006076624 A1 7/2006

OTHER PUBLICATIONS

W. Lee, K. N. Kurpad, E. B. Boskamp, T. M. Grist, Developments in Active Rung Design for Parallel Transmit Coils, Waukesha, Wisconsin.

(Continued)

*Primary Examiner*—Brij B Shrivastav
(74) *Attorney, Agent, or Firm*—Quarles & Brady LLP (57) ABSTRACT

A RF transmit coil decoupling circuit in a parallel drive configuration comprises a power amplifier and an output matching network to shim the $B_1$ field in response to inhomogeneities therein. The separate coil segments in a transmit array are effectively decoupled from each other despite inherent mutual inductance between coil segments by the decoupling circuit. The output matching network forms a high impedance block seen by the coil elements, while it provides a load line impedance at the output of the power amplifier. The transmission line transformer in the output matching network suppresses higher order harmonics for clearer RF wave forms. It also dampen the Q factor of the output matching network allowing stable operation with a series tuned coil element.

16 Claims, 6 Drawing Sheets

OTHER PUBLICATIONS

W. Lee, E. B. Boskamp, T. M. Grist, K. N. Kurpad, "A Novel Power MOSFET Decoupling Technique for Parallel Transmit Arrays".

Nam, H. et al; "Transmit Surface Coil Array Using RF Current Sources"; Proceedings of the International Society for Magnetic Resonance in Medicine; 13th Scientific Meeting and Exhibition, Miami Beach, FL; 2005; p. 917.

Kurpad, K et al.; "RF Current Element Design for Independent Control of Current Amplitude and Phase in Transmit Phased Arrays"; Concepts in Magnetic Resonance Part B; 2006; pp. 75-83; vol. 29B.

Jevtic, J. et al.; "High Impedance Power Splitter for Transmitting Phased-Array Coils"; International Society for Magnetic Resonance in Medicine; 2005; p. 324; vol. 13.

Hoult, D, et al.; The NMR Multi-Transmit Phased Array: a Cartesian Feedback Approach; Journal of Magnetic Resonance, Academic Press; Orlando, FL; 2004; pp. 64-70; vol. 171.

Lee, R., et al.; "Coupling and Decoupling Theory and Its Application to the MRI Phased Array"; Magnetic Resonance in Medicine, Academic Press; Duluth, MN; 2002; pp. 203-213; vol. 48.

* cited by examiner

MAGNETIC RESONANCE IMAGING RF COIL DECOUPLING CIRCUIT

CROSS-REFERENCE TO RELATED APPLICATIONS

This application is based on provisional application 60/798,872 filed May 9, 2006 entitled "Magnetic Resonance Imaging RF Coil Drive Circuit with Transmission Line Transformer" and claims the benefit thereof.

BACKGROUND OF THE INVENTION

The field of the invention is nuclear magnetic resonance imaging methods and systems. More particularly, the invention relates to systems and methods for decoupling coil elements in an RF transmit coil array used to apply radio frequency magnetic fields to the subject being examined.

When a substance such as human tissue is subjected to a uniform magnetic field (polarizing field $B_0$) applied along the z axis of a Cartesian coordinate system, the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, Mz, may be rotated, or "tipped", into the x-y plane to produce a net transverse magnetic moment $M_t$. A NMR signal is emitted by the excited spins after the excitation signal $B_1$ is terminated, this signal may be received and processed to form an image or produce a spectrum.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Radio frequency antennas, or coils are used to produce the excitation field $B_1$ and other RF magnetic fields in the subject being examined. Such coils are also used to receive the very weak NMR signals that are produced in the subject. Such coils may be so-called "whole body" coils that are large enough to produce a uniform magnetic field for a human subject or, they can be much smaller "local" coils that are designed for specific clinical applications such as head imaging, knee imaging, wrist imaging, etc. Local coils may be either volume coils or surface coils.

The quality of an MR image depends on the homogeneity of the applied excitation field $B_1$. The tipping of the aligned moment $M_z$ into the transverse plane should be as uniform as possible throughout the region of interest (ROI) and this in turn depends on the homogeneity of the excitation field $B_1$ throughout the ROI. MRI systems include a whole-body RF coil that is specifically designed to produce such a homogeneous field throughout the ROI.

The most common whole body coil found in commercial MRI systems is the so-called "birdcage" coil. A birdcage coil has a pair of circular end rings which are bridged by a plurality (typically 8 to 24) of equi-spaced longitudinal straight segments. Traditionally, RF volume coils such as birdcage coils have been used to generate both transmission (Tx) and reception (Rx) $B_1$ fields. In a primary mode, currents in the straight segments are sinusoidally distributed which results in good $B_1$ field uniformity across the axis of the coil. Birdcage coils are the structure of choice in horizontal field MRI systems because they produce a homogeneous magnetic field in the bore of the magnet and they have a high SNR which enables them to pick up the small NMR signals emanating from the examined subject. That is, these coils have a periodic, resonant structure with multiple resonant modes. While birdcage coils and its variants generate uniform $B_1$ fields at low $B_0$ field strengths (1.5 T and below), their performance is compromised at higher $B_0$ field strengths (3 T and above).

The homogeneity of the $B_1$ field is affected by the presence of the subject being imaged due to the different electrical characteristics of various tissue types found in the human body. Thus, even though the RF coil is shimmed by adjusting capacitors distributed throughout its structure to produce a homogeneous RF field, this homogeneity is lost when a subject is placed in the scanner. This problem is magnified as the polarizing field $B_0$ is increased and the resulting Larmor frequency increases due to the increased coil-sample interactions at higher frequencies.

Recognizing this problem in MRI systems with higher $B_0$ field strengths, techniques have been developed to shim the $B_1$ field after the subject is placed in the scanner. As described in U.S. Pat. No. 6,982,554 issued on Jan. 3, 2006 and entitled "System And Method For Operating Transmit Or Transmit/Receive Elements In An MR System", the phase and current magnitude applied to the individual segments in a birdcage RF coil can be separately controlled to shim the RF field it produces. As described in published US Pat. Application No. 2005/0231203, field on Mar. 18, 2005 and entitled "Method And Magnetic Resonance System For Homogenizing the $B_1$ Field", an iterative method may be used to measure RF field homogeneity after the subject is in place and make adjustments in the RF field until it reaches an acceptable homogeneous level.

Figure 3:
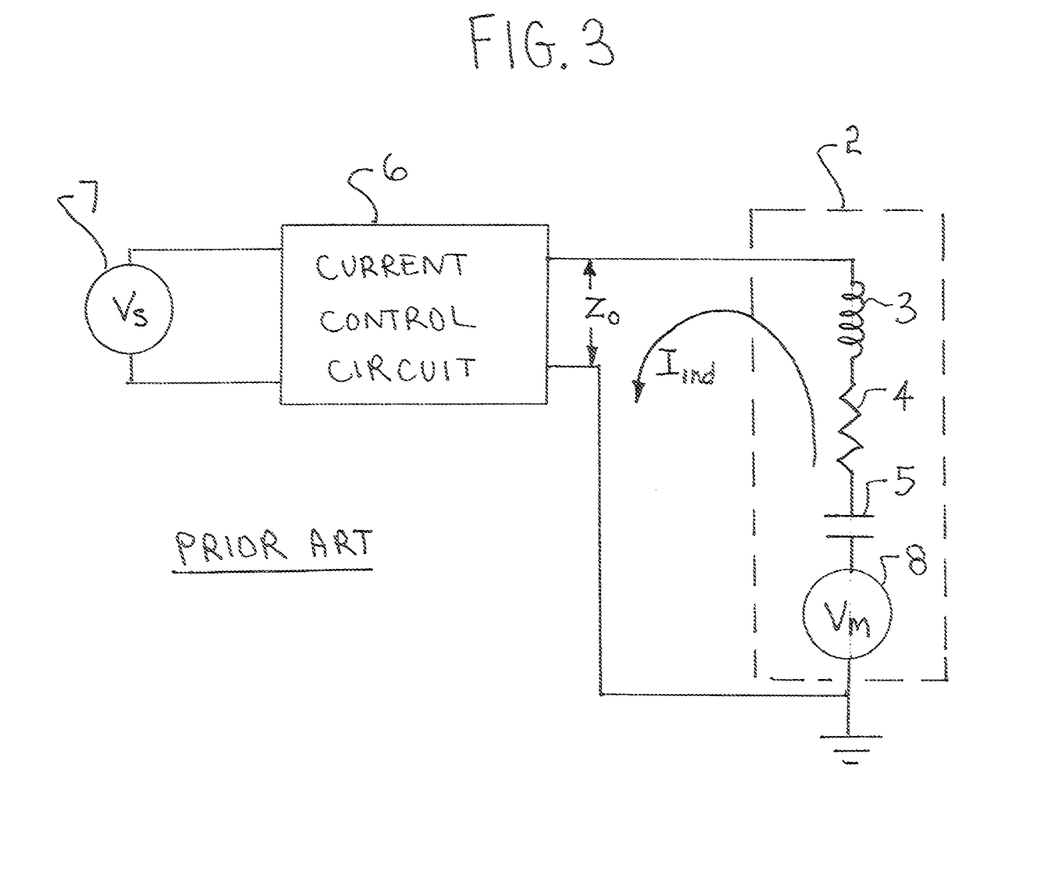
FIG. 3 is an electrical schematic diagram of one RF coil segment that is separately driven as taught by the prior art.

Trimming the $B_1$ field by adjusting the currents in the separate coil segments to match the dielectric loading of the subject works well in principle but is difficult in practice to achieve. Unfortunately, because of the mutual inductance between RF coil segments, a change in the RF current in one segment to trim the RF field in a desired manner has the undesirable result of also changing the RF currents in adjacent RF coil segments through mutual inductance. Referring to FIG. 3, a single RF coil segment 2 is shown schematically to include an inductance 3, resistance 4 and capacitance 5. The inductance 3, being a function of conductor length, capacitance 5 is accordingly selected to tune the segment 2 to a frequency near the Larmor frequency of the scanner. The RF coil segment 2 is connected across the output of a current control circuit 6 that is driven by an input signal 7 to produce a current in the RF coil segment 2 that contributes to a homogeneous $B_1$ field. The problem is that an additional current $I_{ind}$ is also flowing through the RF coil segment 2 due to signals indicated at 8 induced by the currents flowing in adjacent RF coil segments. Because the output impedance $Z_0$ of the current control circuit 6 is necessarily low in order to efficiently drive large currents into the RF coil segment 2, the induced currents $I_M$ can be substantial, which can result in substantial artifacts in a resulting image.

With multiple driving loops tuned at single image frequency, as in phased array coil, the current on each loop is a superposition of the driven current and currents induced by neighboring transmitters due to electromagnetic induction. The $B_1$ field generated by each transmitting element is, therefore, due to the resultant current on the element. When transmitting elements are strongly coupled to each other as in Birdcage coils or transverse electromagnetic (TEM) coils, independent control of $B_1$ fields on each transmitting element becomes very difficult.

The coupling through the mutual impedance in two interacting elements can be minimized either by canceling the mutual impedance or reducing the current in the coil itself. Mutual inductance is typically cancelled by either partial overlap of two adjacent coils (transformer type decoupling) or by using decoupling capacitors. Although the mutual inductance can be driven to zero between two coils, those configurations are restricted to decoupling only the nearest neighbor.

Capacitive ladder networks can be used to decouple not only the nearest element but also distant neighbors by cancelling decaying mutual inductances as the distance between the coil elements increases. However, this technique is not robust because it requires a perfectly symmetrical arrangement of identical array elements and is sensitive to the placement of a sample and its electrical properties.

Alternatively, particularly in a receive array, the preamplifier decoupling network is used to isolate the coil elements by creating a large impedance block at the terminals of each receive element, thereby, suppressing currents driven by the spin induced electromotive force (emf). The simultaneous input matching network enables the formation of a high-impedance block with an optimum noise match for the minimum noise figure at the input terminal of preamplifier. Such a matching network is based on the fact that optimum noise matching is not generally the same as conjugate impedance matching at the preamplifier input terminal. This decoupling technique allows flexible receiver array design for the optimum noise correlation among array elements. Furthermore, the mismatched impedance seen by a coil element is known to reduce receiver ringing, thereby, improving transient response of a receiver coil. However, this technique is unusable at the output terminal of a power device in a transmit phased array because of the suppression of driven current used to generate desired $B_1$ fields.

A Cartesian feedback approach in two interacting transmit elements has been proposed to suppress the induced current using the negative feedback. The feedback efficacy, however, depends heavily on the large open loop gain of the transmitter based on the small bandwidth of the feedback filter. As such, this approach limits the RF excitation bandwidth in some special applications. Furthermore, the inherent narrow bandwidth and system complexity of this approach have rendered it impractical for implementation at this time.

Therefore, it would be desirable to have a system and method for decoupling elements in an RF coil array and independently controlling the current flowing through elements in an RF coil.

SUMMARY OF THE INVENTION

The present invention overcomes the aforementioned drawbacks by providing a decoupling circuit for a RF coil that includes power amplifier (e.g. power MOSFET) and matching networks that provide inter-channel isolation in terms of the driven current amplitude. The circuit may be used with a whole body RF coil on an MRI system or a local coil with an MRI system to transmit a uniform $B_1$ magnetic field.

The present invention is a decoupling circuit for individual coil elements or segments of an RF coil that enables each coil element or segment to be accurately driven without interference from currents induced from any neighboring coil segments or elements. An output matching network of the decoupling circuit improves the driven power efficiency and its capability and at the same time presents a high impedance to currents induced into the coil segment from other coil segments. To do so, the matching network utilizes the principle that power matching for a chosen power device is not generally the same as conjugate impedance matching.

Another aspect of the invention is to construct a transmission line transformer that dampens the Q factor of the output matching network and improves the system bandwidth. In addition, the frequency response of the output matching network suppresses the higher order harmonics generated by the driving amplifier allowing clear RF waveforms.

Yet another aspect of the invention is a drive circuit for an input matching network that provides a high unloaded Q factor at the drain creating a high output drain impedance with a shunt inductor. This high output impedance differs from the load line impedance allowing a simultaneous output matching network for a chosen power device.

DESCRIPTION OF THE PREFERRED EMBODIMENT

Figure 1:
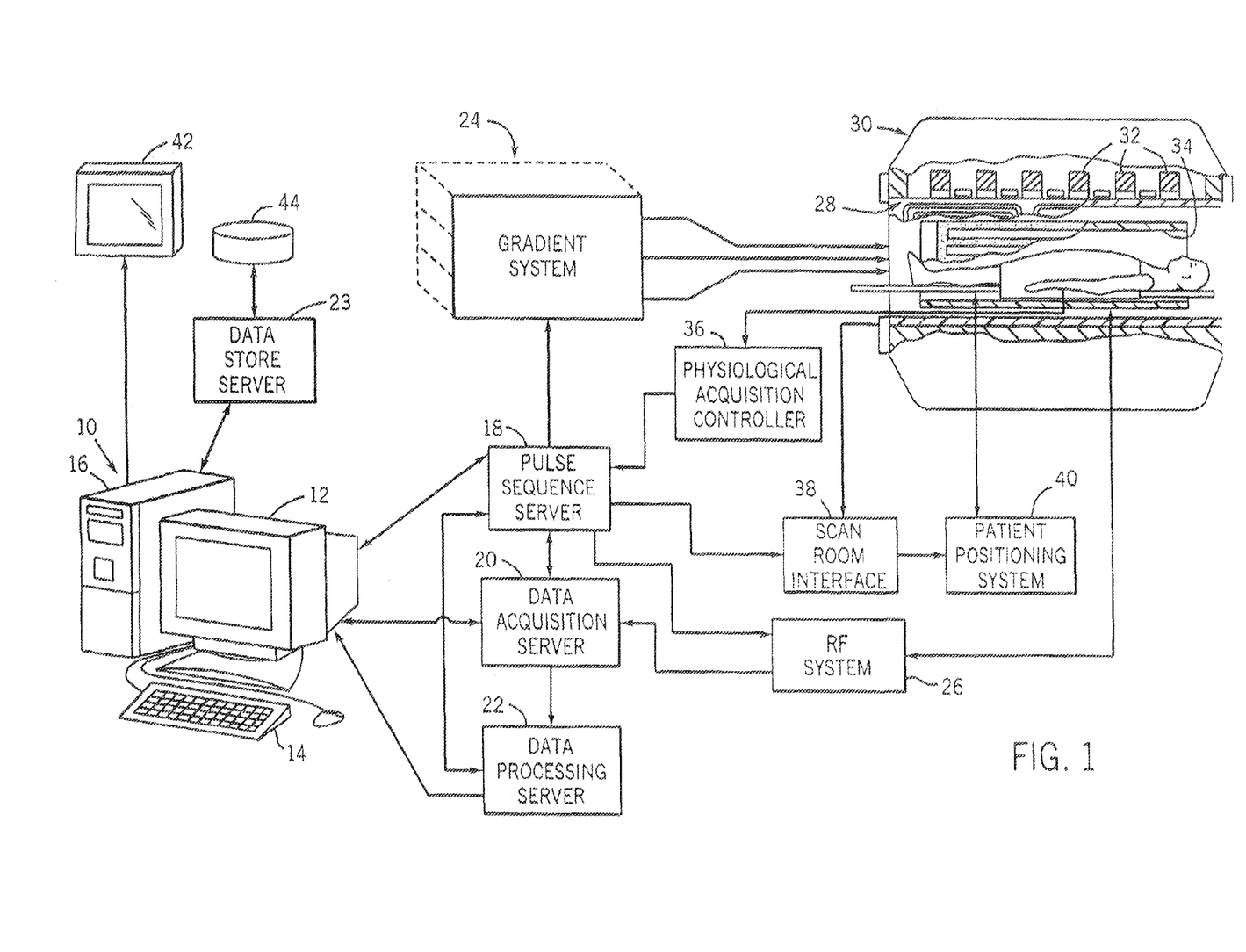
FIG. 1 is a block diagram of an MRI system which employs the present invention.

Referring particularly to FIG. 1, the preferred embodiment of the invention is employed in an MRI system. The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers: a pulse sequence server 18; a data acquisition server 20; a data processing server 22, and a data store server 23. In the preferred embodiment the data store server 23 is performed by the workstation processor 16 and associated disc drive interface circuitry. The remaining three servers 18, 20 and 22 are performed by separate processors mounted in a single enclosure and interconnected using a 64-bit backplane bus. The pulse sequence server 18 employs a commercially available microprocessor and a commercially available quad communication controller. The data acquisition server 20 and data processing server 22 both employ the same commercially available microprocessor and the data processing server 22 further includes one or more array processors based on commercially available parallel vector processors.

The workstation 10 and each processor for the servers 18, 20 and 22 are connected to a serial communications network. This serial network conveys data that is downloaded to the servers 18, 20 and 22 from the workstation 10 and it conveys tag data that is communicated between the servers and between the workstation and the servers. In addition, a high speed data link is provided between the data processing server 22 and the workstation 10 in order to convey image data to the data store server 23.

The pulse sequence server 18 functions in response to program elements downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$ and $G_z$ used for position encoding NMR signals. The gradient coil assembly 28 forms part of a magnet assembly 30 which includes a polarizing magnet 32 and a whole-body RF coil 34 made in accordance with the teachings of the present invention.

RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays.

The RF system 26 also includes one or more RF receiver channels. Each RF receiver channel includes an RF amplifier that amplifies the NMR signal received by the RF coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M=\sqrt{I^2+Q^2} \qquad \text{Eqn. 1;}$$

and the phase of the received NMR signal may also be determined:

$$\phi=\tan^{-1}Q/I \qquad \text{Eqn. 2.}$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

It should be apparent that the pulse sequence server 18 performs real-time control of MRI system elements during a scan. As a result, it is necessary that its hardware elements be operated with program instructions that are executed in a timely manner by run-time programs. The description components for a scan prescription are downloaded from the workstation 10 in the form of objects. The pulse sequence server 18 contains programs which receive these objects and converts them to objects that are employed by the run-time programs.

The digitized NMR signal samples produced by the RF system 26 are received by the data acquisition server 20. The data acquisition server 20 operates in response to description components downloaded from the workstation 10 to receive the real-time NMR data and provide buffer storage such that no data is lost by data overrun. In some scans the data acquisition server 20 does little more than pass the acquired NMR data to the data processor server 22. However, in scans which require information derived from acquired NMR data to control the further performance of the scan, the data acquisition server 20 is programmed to produce such information and convey it to the pulse sequence server 18. For example, during prescans NMR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process NMR signals used to detect the arrival of contrast agent in an MRA scan. In all these examples the data acquisition server 20 acquires NMR data and processes it in real-time to produce information which is used to control the scan.

The data processing server 22 receives NMR data from the data acquisition server 20 and processes it in accordance with description components downloaded from the workstation 10. Such processing may include, for example: Fourier transformation of raw k-space NMR data to produce two or three-dimensional images; the application of filters to a reconstructed image; the performance of a backprojection image reconstruction of acquired NMR data; the calculation of functional MR images; the calculation of motion or flow images; etc.

Images reconstructed by the data processing server 22 are conveyed back to the workstation 10 where they are stored. Real-time images are stored in a data base memory cache (not shown) from which they may be output to operator display 12 or a display 42 which is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 2:
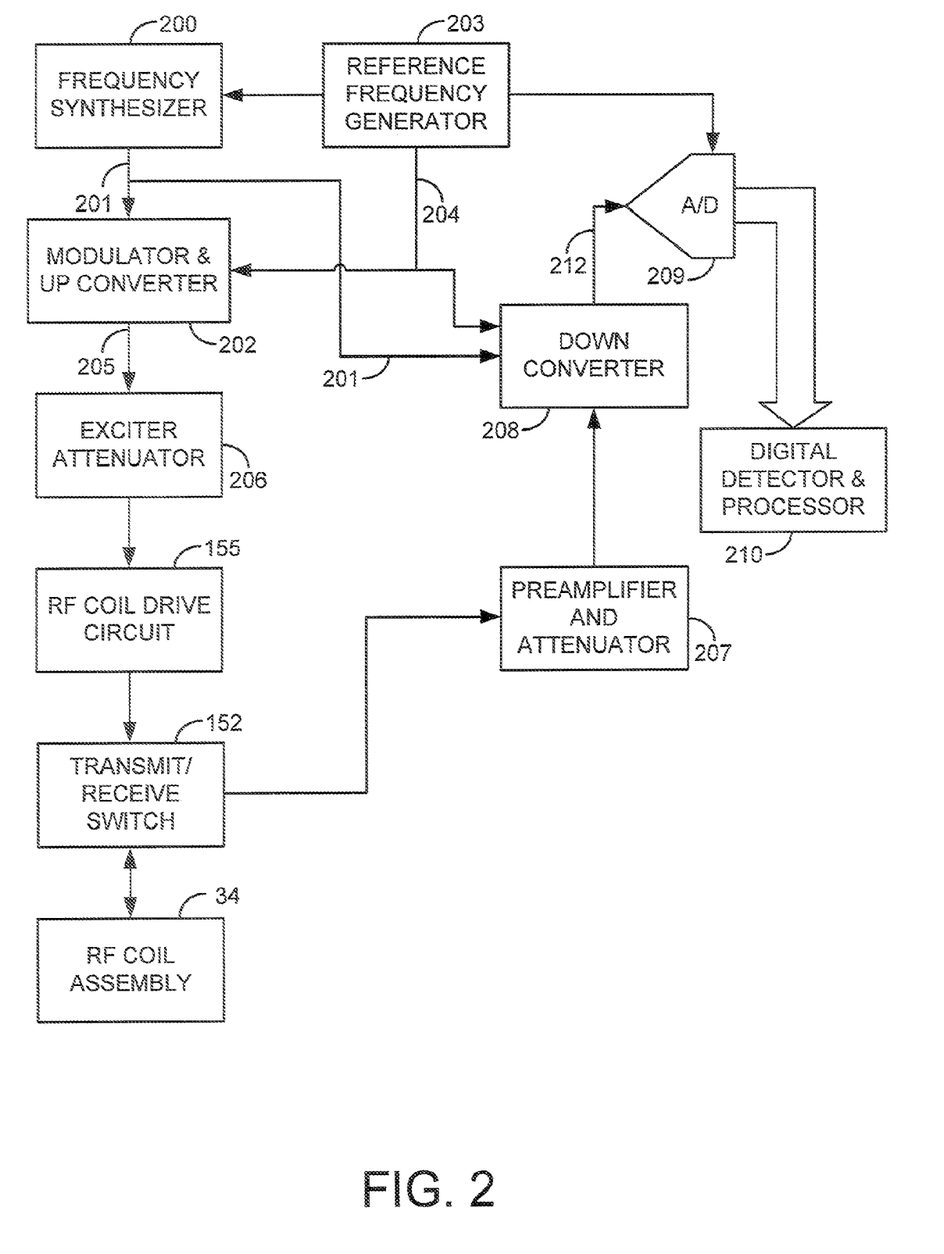
FIG. 2 is a block diagram of the RF system that forms part of the MRI system of FIG. 1.

Referring particularly to FIG. 2, the RF system 26 includes a transmitter that produces a prescribed RF excitation field. The base, or carrier, frequency of this RF excitation field is produced under control of a frequency synthesizer 200 which receives a set of digital signals from the pulse sequence server 18. These digital signals indicate the frequency and phase of the RF carrier signal produced at an output 201. The RF carrier is applied to a modulator and up converter 202 where its amplitude is modulated in response to a signal R(t) also received from the pulse sequence server 18. The signal R(t) defines the envelope of the RF excitation pulse to be produced and is produced by sequentially reading out a series of stored digital values. These stored digital values may, be changed to enable any desired RF pulse envelope to be produced.

The magnitude of the RF excitation pulse produced at output 205 is attenuated by an exciter attenuator circuit 206 which receives a digital command from the pulse sequence server 18. The attenuated RF excitation pulses are applied to an RF coil drive circuit 155 that, as will be described in detail below, drives the RF coil 34 through a transmit/receive switch 152. For a more detailed description of this transmitter section reference is made to U.S. Pat. No. 4,952,877 which is incorporated herein by reference.

Referring still to FIG. 2 the NMR signal produced by the subject is picked up by the RF coil 34 and applied through the transmit/receive switch 152 to a preamplifier and attenuator 207. The preamplifier and attenuator 207 amplify the NMR signal by an amount determined by a digital attenuation signal received from the pulse sequence server 18. The received NMR signal is at or around the Larmor frequency, and this high frequency signal is down converted in a two step process by a down converter 208 which first mixes the NMR signal with the carrier signal on line 201 and then mixes the resulting difference signal with a reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output to the data acquisition server 20. The reference signal as well as the sampling signal applied to the A/D converter 209 are produced by a reference frequency generator 203. For a more detailed description of the receiver, reference is made to U.S. Pat. No. 4,992,736 which is incorporated herein by reference.

The transmit/receive switch 152 is used when the RF coil 34 is employed to both produce the uniform $B_1$ field and receive the resulting NMR signals. It is operated by the pulse sequence server 18 to switch to the transmitter during parts of the pulse sequence in which RF fields are to be produced, and to switch connection to the receiver when NMR data is to be acquired. The RF transmit signal is coupled to the RF coil assembly 34 that will be described in detail below.

To overcome the above-described drawbacks associated with Tx $B_1$ inhomogeneity, individual and independent amplitude and phase control of the $B_1$ field generated by each array element in a transmit coil can be used to enable correction of deterministic inhomogeneous patterns. However, to achieve such independent elemental $B_1$ field in the presence of large mutual coupling $B_1$ fields generated by neighboring array elements can be difficult. That is, the currents induced by the $B_1$ fields of neighboring elements have to be suppressed while allowing a controlled current to be driven in a transmitting element. Traditional decoupling techniques, such as partial overlap or a capacitive decoupling network, are unsuitable. That is, as with Rx arrays, decoupling is achieved only with nearest neighboring elements, which allows the $B_1$ fields caused by distant neighbors to couple into the transmit element. While microstrip transmitting elements achieve decoupling, the decoupling comes at the cost of a rapidly attenuating $B_1$ field towards the center of the imaging volume.

The present invention recognizes that an active rung topology can be employed as a power MOSFET decoupling network. This approach uses an active device as a controlled RF current source directly connected to a series-tuned current element carrying induced voltages. Due to its unidirectional property, the induced RF energy from other transmitters is suppressed in its reverse direction like an active isolator. This technique for manipulating induced RF energy with an active device is promising because it allows the flexibility of a transmit array design regardless of induced voltage. However, the active-rung technique is limited by the output impedance of a chosen power MOSFET because the output impedance becomes a part of induced current path.

While an active rung topology can be employed to utilize a power MOSFET, it comes at the cost of reduced drive efficiency and provides only a limited decoupling performance that depends on the output impedance of the chosen power device. As will be described, the present invention provides an output decoupling network and an input matching topology for a chosen power MOSFET that provides increased decoupling between neighboring elements while simultaneously increasing the drive efficiency compared to the active-rung design.

Figure 4:
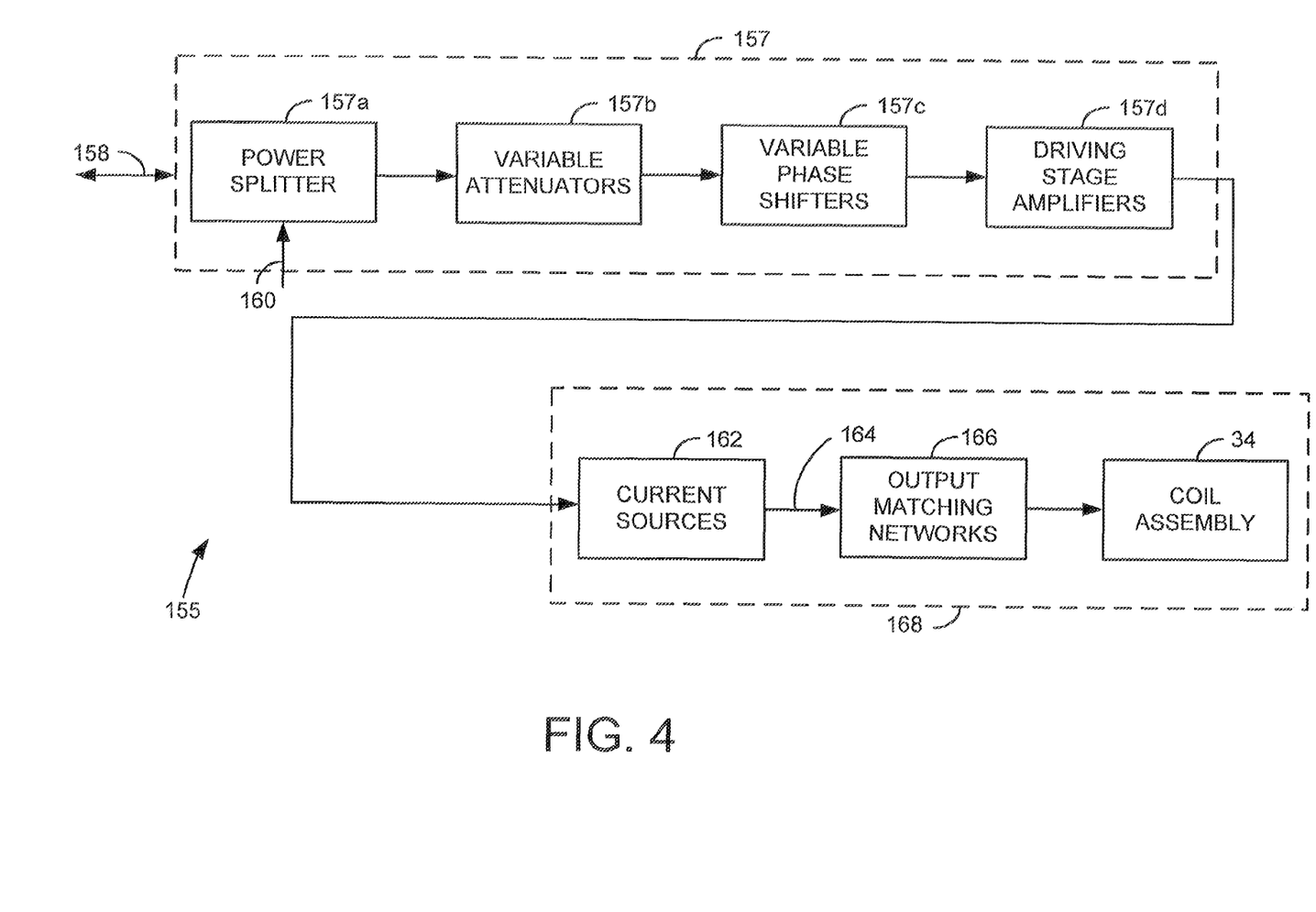
FIG. 4 a block diagram of a parallel RF transmit coil drive circuit and RF coil assembly which form part of the RF system of FIG. 2.

Referring particularly to FIG. 4, the RF coil drive circuit 155 includes a control circuit portion 157 that includes a power splitter 157a, variable attenuators 157b, variable phase shifters 157c, and driving stage amplifiers 157d that are connected to a decoupling network 168. The circuit 157 produces eight output signals during the transmit mode that are phase shifted (0°, 45°, 90°, 135°, 180°, 225°, 270°, 315°), delivered to the decoupling network 168, and provided to drive the respective eight segments in the coil assembly 34. In addition, the magnitude and phase of each of these output signals can be adjusted for $B_1$ field shimming purposes in response to commands received at input 160.

The signals provided to the decoupling network 168 are coupled to eight separate channels in a voltage controlled current source 162 mounted on a transmit coil, as will be described, through coaxial cables. As will be described in detail below, the eight current sources 162 produce eight driven currents at the outputs 164 that drive the respective eight segments in the RF coil assembly 34 at the commanded frequency, phase, and magnitude. However, rather than the output 164 of current sources 162 being directly connected to the RF coil segments in the assembly 34, the outputs 164 drive respective coil elements through output matching networks 166. As will be described in detail below, each channel in the output matching network 166 provides a low input impedance (load line impedance) at the outputs 164 to extract the maximum power out of the current source 162. The output matching networks 166 also provides efficient coupling of the commanded RF current to its associated coil segment in the coil assembly 34, and it provides a very high impedance to any induced current flow in its associated coil segment.

The RF coil assembly 34 can take many forms. For example, the RF coil assembly 34 may be a traditional transverse electromagnetic (TEM), a modified TEM coil, such as described in U.S. patent application Ser. No. 11/726,643, or even a traditional birdcage coil or surface coils arranged arbitrarily. In any case, rather than driving this coil assembly with a single signal or a pair of quadrature signals as is commonly done, each of the eight segments or rungs is separately driven to provide more control over the RF field that is produced.

Figure 5:
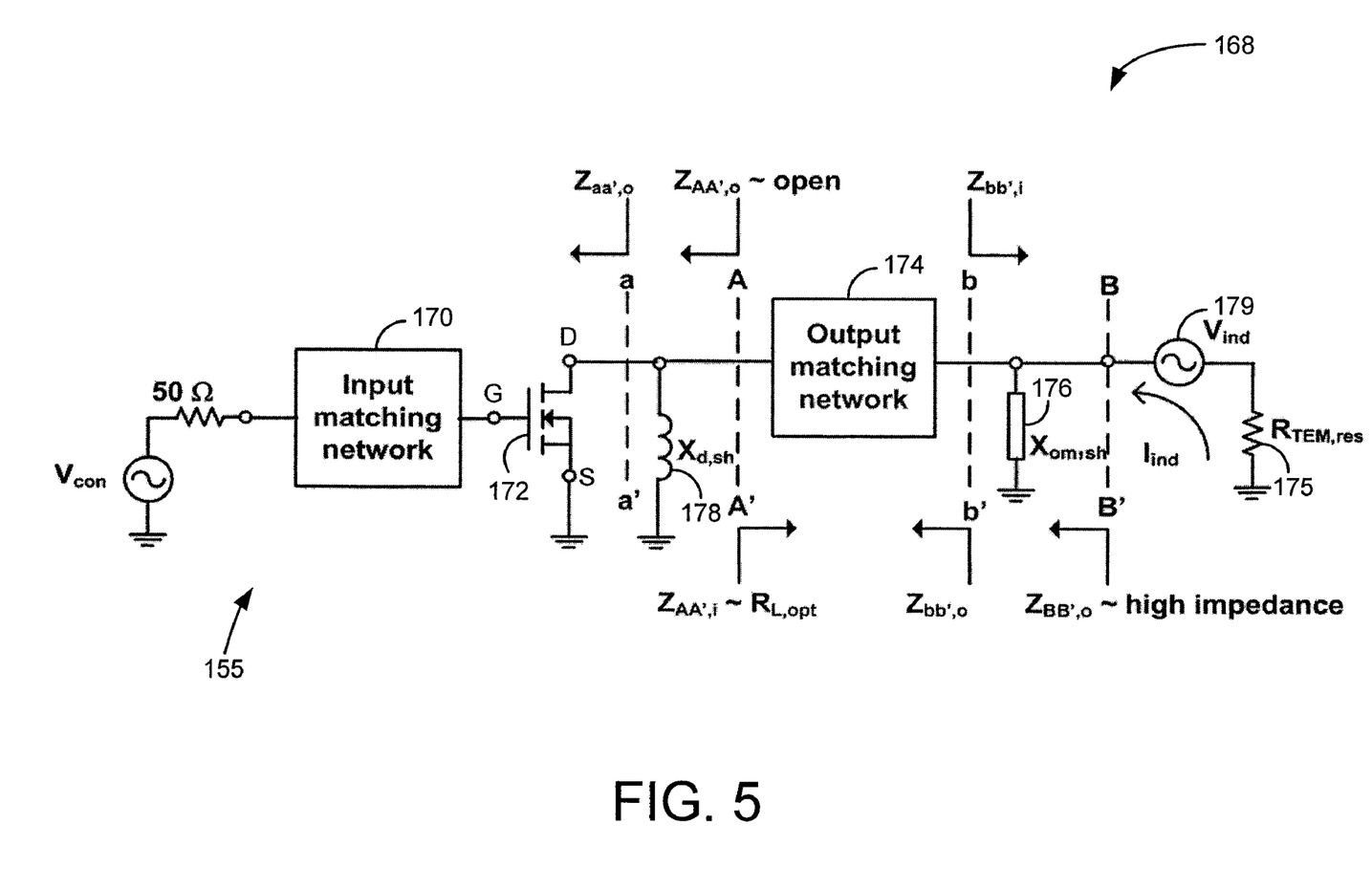
FIG. 5 is an electrical schematic diagram of a single RF transmit decoupling network integrated with a tuned coil segment in the associated drive circuit of FIG. 4 in accordance with the present invention.

Referring particularly to FIG. 5, a schematic of a portion 162, 166 of the drive circuit 155 forming a single-ended power MOSFET decoupling network 168 in accordance with the present invention is illustrated. The MOSFET decoupling network 168 includes a variety of sub-systems. For example, the MOSFET decoupling network 168 includes an input matching network 170, a power MOSFET 172, and an output matching network 174. In this regard, the decoupling network 168 can be divided into a variety of sections along lines a/a', A/A', b/b', and B/B'. As is well know, the MOSFET 172 includes a drain terminal, D, a gate terminal, G, and a source terminal, S.

The decoupling network 168 acts as a simultaneous output matching network of a power MOSFET 172, which suppresses induced current by forming a high output impedance seen by an induced voltage, $V_{ind}$, and sets up the load-line impedance at the drain terminal, D, of the MOSFET 172. It should be noted that the term "matching" does not refer to conjugate matching. Rather, it refers to the load line matching for a chosen power device in view of driven current source. Such a matching network is accomplished when the output capacitance of the MOSFET 172, $C_{oss}$, is not significantly high and, therefore, it can produce a high output impedance block with a shunt inductance 178 at the drain terminal, D, with the aid of the input matching network 170. This allows a high output reflection coefficient at A-A' Accordingly, the high output reflection coefficient allows a high impedance block at B-B' seen by the current element. As will be described in detail with respect to FIG. 6, the output matching network 174 also accommodates higher-order harmonic suppression for clear RF wave forms due to its band-pass response at the imaging frequency.

The load resistance at B-B', $R_{TEM,res}$ 175, is a resistance of a series tuned coil element, representing distributed loss along that element In view of the driven current, the output matching network 174 sees the load impedance at b-b', $Z_{bb',i} \sim R_{TEM,res}$ when a shunt reactance 176 at b-b', $X_{om,sh}$, is much greater than $R_{TEM,res}$, and the matching network 174 transforms $R_{TEM,res}$ to $R_{L,opt}$ at A-A'. A shunt inductor 178, $X_{d,sh}$, is connected to the drain, D, of the MOSFET 172 to cancel out the output capacitance of the MOSFET 172, creating a high drain impedance, $Z_{AA',o}$, under the control of the input matching network 170. An induced voltage 179, $V_{ind}$, at the element terminal depends on the geometry of the array, and results in the induced current flow, $I_{ind}$, along the loop formed by the coil element 175 and the output terminal impedance at B-B', $Z_{BB',o}$. In case $X_{om,sh}$ is in parallel resonance with the output impedance at b-b', $Z_{bb',o}$, then $Z_{BB',o}$ is proportional to the square of the Q factor at b-b', $Q_{bb',o}$, as given by:

$$Z_{BB',o} = Z_{bb',o} // X_{om,sh} = R_{bb',o}(1 + Q_{bb',o}^2) \quad \text{Eqn. 3}$$

$$\text{when, } X_{om,sh} = R_{bb',o}\left(Q_{bb',o} + \frac{1}{Q_{bb',o}}\right);$$

where $Q_{bb',o}$ is determined by the output matching network 174 and the drain impedance, $Z_{AA',o}$.

The amount of induced current suppression may be defined by the ratio of the induced current, $I_{ind}$, to the driven current, $I_{driv}$, at B-B' with the same amount of driven and induced voltages at B-B' as shown in Eqn. 4. In case $Z_{BB',o}$ is much greater than $R_{TEM,res}$, $Z_{BB',o}$ dominates the induced current suppression, as given by:

$$20\log_{10}\left(\frac{i_{ind}}{i_{dri}}\right) = \quad \text{Eqn. 4}$$

$$20\log_{10}\left(\frac{R_{TEM,res}}{R_{TEM,res} + Z_{BB',o}}\right) \sim -20\log_{10} R_{bb',o}(1 + Q_{bb',o}^2)[\text{dB}].$$

As addressed above, inter-channel coupling due to mutual impedance can be reduced by suppressing the induced current $I_{ind}$ on each current element in the coil array of FIG. 4. As in preamplifier decoupling techniques, if the output reflection coefficient at the drain terminal, D, approaches unity, a high impedance block seen by the induced voltage 179 is accomplished by the output matching network 174 at each element terminal B-B'.

Figure 6:
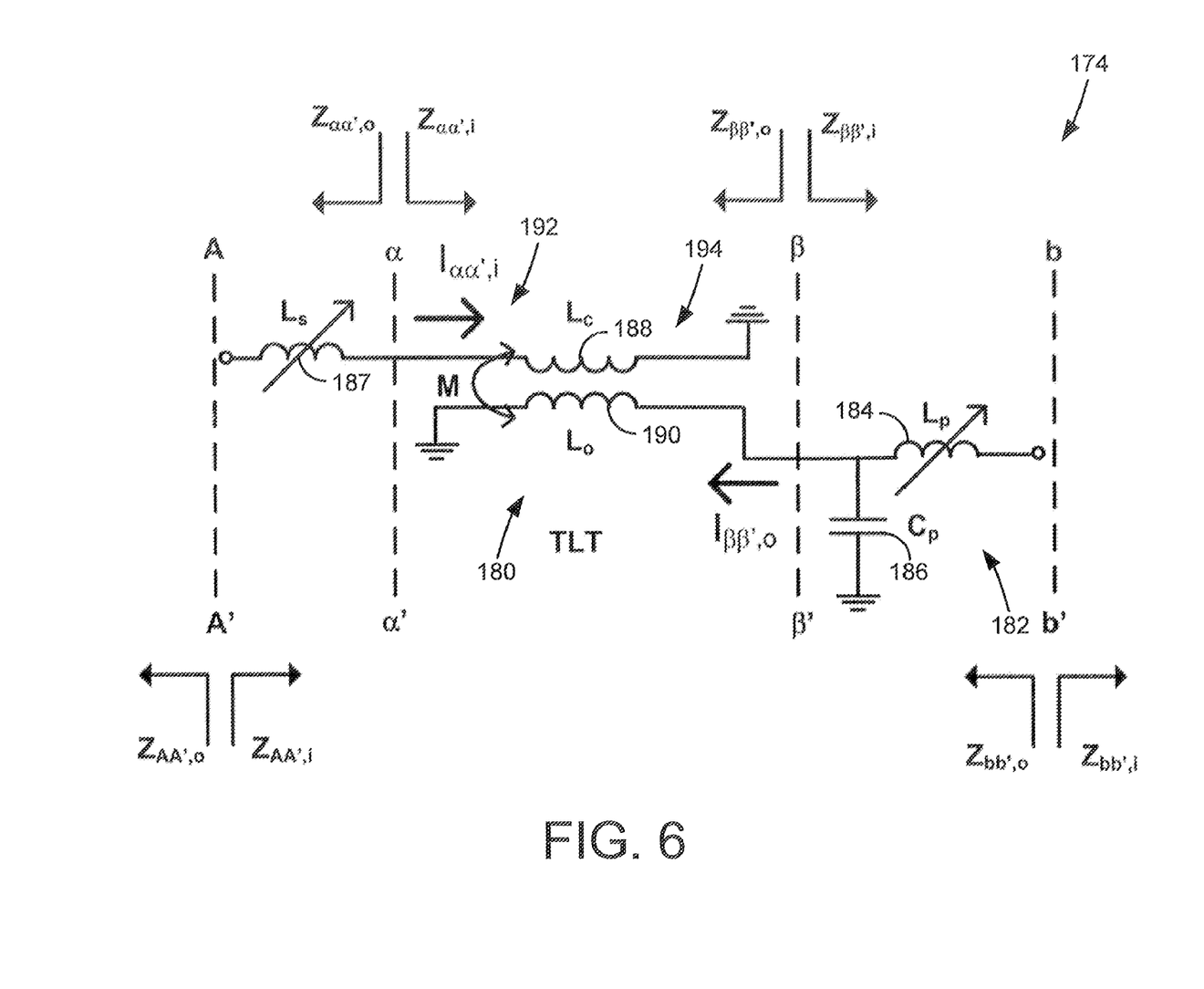
FIG. 6 is a detailed schematic of an output matching network in accordance with the present invention.

Referring now to FIG. 6, the matching network 174 includes a transmission line transformer (TLT) 180, and a parallel pi-tank circuit 182 formed by an inductor $L_p$ 184 and a capacitor $C_p$ 186. Additionally, the matching network includes a series variable inductor $L_s$ 187 configured to cancel input reactance at $\alpha$-$\alpha\alpha'$, $Z_{\alpha\alpha',i}$.

The output matching network 174 can be implemented on a printed circuit board including the TLT 180 formed by a 50 Ohm, $\lambda_c/10$ long, semi-rigid coaxial conductor and having mounted thereon the capacitive and inductive components required to form the tank 182. As will be described in detail below, in accordance with one embodiment, the TLT 180 is formed by a coaxial cable having a center conductor 188 and a surrounding shielding 190. The TLT 180 is curled to reduce the outer shield current. For example, the TLT 180 may be formed by a length of 50 ohm coaxial cable curled to have a 1.3-cm diameter and be 1.9-cm long.

Referring to FIGS. 4 and 6, the output 164 of the current source 162 connects to the center conductor 188 of the TLT 180 and the same center conductor 188 is connected to ground at the output end 194. The shielding 190 included on the TLT 180 is connected to ground at the input end 192 of and the same shield 190 is connected to ground through the capacitor $C_p$ 186 at the output end 194.

The cable has a length that is $\lambda_c/10$, which is one-tenth of the cable wavelength of the Larmor frequency at which the system operates (i.e., the RF wavelength within the dielectric of the coaxial cable, which is, generally, shorter than the wavelength in free space). However, it is contemplated that the cable length may vary some to have a minimum insertion loss of the TLT for example, $\lambda/8$. As will be described, the capacitor $C_p$ 186 is chosen to resonate with the reactance observed at b-b' such that the minimum insertion loss of the TLT 180 is achieved.

The impedance of the series tuned coil element 175 is small and need to be scaled up to the load line resistance at A-A' in FIG. 5. The above mentioned TLT structure has a finite impedance scaling factor. The impedance scaling factor of the TLT 180, $|n_{eff}|^2$, is assessed by measuring self and terminal impedances through Eqn. 5. Where $n_{eff}$ is the terminal current ratio of $I_{\beta\beta',o}$ to $I_{\alpha\alpha',i}$ and $j\omega L_c$ and $j\omega L_o$, are self impedances of the center and shield conductors, respectively and $Z_{\alpha\alpha',i}$ and $Z_{\beta\beta',o}$, are terminal impedances measured at $\alpha$-$\alpha'$ and $\beta$-$\beta'$, respectively in FIG. 6:

$$|n_{eff}|^2 = \left|\frac{Z_{\alpha\alpha',i}}{Z_{\beta\beta',i}}\right| = \left|\frac{Z_{\alpha\alpha',i}|Z_{\beta\beta',i}=Z_L - j\omega L_c}{Z_{\beta\beta',o}|Z_{\beta\beta',i}=Z_L - j\omega L_o}\right|. \quad \text{Eqn. 5}$$

The inductance $L_p$ in FIG. 6 is chosen to have the load line resistance at A-A' in FIG. 5 with the determined capacitance $C_p$. The tank circuit 182 suppresses the higher order harmonics as a low pass filter (LPF) circuit.

In view of the output impedance at b-b' $Z_{bb',o}$ is dominated by the off resonance, $X_{Lp}$-$X_{Cp}$, because the output impedance at $\beta$-$\beta'$, $Z_{\beta\beta',o}$, is large enough compared to the $C_p$ 186 with the high $Z_{AA',o}$. The amount of the off resonance determines the $Q_{bb',o}$, and, thereby the $Z_{BB',o}$, with a shunt inductor, $X_{om,sh}$, 176 in FIG. 5.

This high output impedance block, $Z_{BB',o}$, keeps the induced current, $I_{ind}$, at a substantially low level, such that it does not interfere with the driven current needed to produce the desired RF magnetic field. The induced currents, $I_{ind}$, caused by the inherent mutual inductance between the RF coil segments is thus reduced to an insignificant amount.

Furthermore, the frequency response of the output matching network 174 is designed to suppress higher order harmonics generated by the driving amplifier and, thereby, allow clear RF waveforms. Specifically, the frequency response of the output matching network 174 is designed for minimum insertion loss at the Larmor frequency. As will be described, the frequency response of the network substantially suppresses second and third harmonics, for example by the factor of 29.3 and 33.2 dB, respectively due to the insertion loss of the output matching network 174.

Even with a high power rating device the above-described invention may be applied if the chosen power device provides a high unloaded Q factor at the drain.

The present invention has been described in terms of the various embodiments, and it should be appreciated that many equivalents, alternatives, variations, and modifications, aside from those expressly stated, are possible and within the scope of the invention. Therefore, the invention should not be limited to a particular described embodiment.

We claim:

1. An RF coil drive circuit for a magnetic resonance imaging system having a plurality of separately controllable coil segments, the drive circuit comprising:
    a set of separately controllable current sources, one for each separately controllable coil segment;
    a set of output matching circuits, each output matching circuit connecting one of the current sources to one of the coil segments and simultaneously providing a load line impedance to driven currents produced by the current source and a high impedance to currents induced in the coil segment; and
    wherein each output matching circuit includes a transmission line transformer and further comprising a pi-tank circuit connected to a secondary winding of the transformer and a series inductor connected to a primary winding of the transformer.

2. The drive circuit of claim 1 wherein the transmission line transformer is formed from a coaxial cable having a length of approximately one-tenth of the wavelength of the Larmor frequency.

3. The drive circuit of claim 2 wherein the coaxial cable includes a center conductor forming the primary winding and a shield conductor forming the secondary winding.

4. The drive circuit of claim 1 wherein the pi-tank circuit includes at least one shunt capacitor and a series inductor and is configured to transform the coil segment impedance to a desired impedance at the secondary winding of the transformer and create a high impedance block seen by the coil segments.

5. The drive circuit of claim 4 wherein the current source includes a power MOSFET and further comprising a shunt inductance arranged at a drain terminal of the power MOSFET to present the substantially high output impedance block.

6. The drive circuit of claim 5 wherein the high impedance block that is formed by the shunt inductor at the drain terminal provides an impedance mismatch at a coil segment terminal to suppress induced currents.

7. The drive circuit of claim 1 wherein the current source includes a power semiconductor having a drain and wherein the output matching circuit includes a power semiconductor having a drain and wherein the series inductor is configured to cancel a reactance of an impedance presented in the primary winding of the transformer to present a load-line resistance at the drain.

8. The drive circuit of claim 1 wherein the controllable current source includes a power MOSFET.

9. A drive circuit for a magnetic resonance imaging system RF coil having a plurality of separately controllable segments connected to be driven by a plurality of respective separately controllable current sources, the drive circuit comprising:
    a plurality of decoupling networks, each decoupling network connected between respective separately controllable segments of the RF coil and separately controllable current sources and comprising:
    an input matching network connected to the respective separately controllable current source;
    a power semi-conductor coupled to the input matching network;
    an output matching network connected to the power semi-conductor;
    wherein the input matching network, the power semi-conductor, and the output matching network combine to simultaneously present a substantially low impedance to currents produced by the respective separately controllable current source and a substantially high impedance to currents induced in the respective separately controllable coil segment; and
    wherein the output matching network includes a transformer formed from a coiled coaxial conductor and a pi-tank circuit formed by parallel arrangement of an inductive component and capacitive components.

10. The drive circuit of claim 9 wherein the transformer is configured to dampen a Q factor of the output matching network and, thereby, improve bandwidth of the output power matching network.

11. The drive circuit of claim 9 wherein the coaxial cable has a length of approximately one-tenth of the wavelength of the Larmor frequency.

12. The drive circuit of claim 9 wherein the coaxial cable includes a center conductor forming one of a primary transformer winding and a secondary transformer winding.

13. The drive circuit of claim 12 wherein the coaxial cable includes a shielding surrounding the center conductor and forming an other of the primary transformer winding and the secondary transformer winding.

14. The drive circuit of claim 9 wherein the power matching network is configured has a frequency response configured to suppress high order harmonics generated by the respective separately controllable current sources.

15. The drive circuit of claim 9 wherein the input matching network provides a substantially high unloaded Q factor at an output of the power semi-conductor to present a substantially high output impedance.

16. The drive circuit of claim 15 further comprising a shunt inductor coupled to the power semi-conductor at the output of the power semi-conductor to present the substantially high output impedance, which differs from a load line impedance of the plurality of separately controllable segments.

* * * * *